United States Patent [19]

Yamazaki et al.

[11] Patent Number: 5,384,531
[45] Date of Patent: Jan. 24, 1995

[54] APPARATUS FOR INSPECTING CHARACTERISTICS OF SEMICONDUCTOR CHIPS

[75] Inventors: Mitsuru Yamazaki; Masakazu Yashiro; Toshiya Ijichi, all of Itami, Japan

[73] Assignees: Mitsubishi Electrical Engineering Co. Ltd.; Mitsubishi Denki Kabushiki Kaisha, both of Tokyo, Japan

[21] Appl. No.: 940,838

[22] Filed: Sep. 4, 1992

[30] Foreign Application Priority Data

Sep. 5, 1991 [JP] Japan ................. 3-225784

[51] Int. Cl.$^6$ ................. G01R 1/06
[52] U.S. Cl. ................. 324/765; 324/73.1
[58] Field of Search .............. 324/158 R, 158 F, 73.1; 414/222, 225, 753, 416, 417; 901/14; 198/573

[56] References Cited

U.S. PATENT DOCUMENTS

| | | | |
|---|---|---|---|
| 4,103,232 | 7/1978 | Sugita et al. | 324/158 F |
| 4,818,169 | 4/1989 | Schram, deceased et al. | 414/753 |
| 4,907,931 | 3/1990 | Mallory et al. | 414/225 |
| 4,938,654 | 7/1990 | Schram | 414/225 |
| 5,105,147 | 4/1992 | Karasikov et al. | 324/158 R |
| 5,148,100 | 9/1992 | Sekiba | 324/158 R |

FOREIGN PATENT DOCUMENTS 60-138136  9/1985  Japan.
60-229347  11/1985  Japan.
62-275925  11/1987  Japan.

Primary Examiner—Vinh Nguyen
Attorney, Agent, or Firm—Leydig Voit & Mayer

[57] ABSTRACT

An apparatus for inspecting characteristics of semiconductor chips has a loading device for loading semiconductor chips onto a testing tray positioned by a servo motor, a CCD camera, an upper contact fixture controlled in X, Y, and $\Theta$ directions, and a lower contacting fixture driven by a cylinder. Positioning of the contact probe pins is accurately achieved by pattern processing and fully automated inspection is made possible. The apparatus is equipped with the same number of contact probe pins as the number of inspection points of a semiconductor chip; hence, all the cells of a semiconductor chip can be inspected as a unit. Therefore, the inspection can be made in a mode similar to practical conditions that occur after final assembly of the semiconductor chip.

3 Claims, 6 Drawing Sheets

APPARATUS FOR INSPECTING CHARACTERISTICS OF SEMICONDUCTOR CHIPS

BACKGROUND OF THE INVENTION

1. Field of the Invention

The present invention relates to an apparatus for inspecting characteristics of a semiconductor device employed for inspecting electrical characteristics of the semiconductor device.

2. Description of the Related Art

In a conventional method, manual inspection by an inspector is done by pushing probe pins on to an inspection point onto the semiconductor chip while inspecting the semiconductor device or semiconductor chip. The conventional inspection method will be described in conjunction with the drawings in FIG. 5 through FIG. 10.

FIG. 5 is a perspective view illustrating a conventional manual inspection method for inspecting electrical characteristics of semiconductor chips. FIG. 6 is a perspective view illustrating a semiconductor chip on which a radiating plate is soldered. FIG. 7 is a sectional view of a contact probe pin of the conventional inspection method. FIG. 8 is a sectional view of a soldering fixture used for soldering the radiating plate of the semiconductor chip according to the prior art. FIG. 9 is a perspective view of a lower fixture for soldering employed for soldering the radiating plate on the semiconductor chip. FIG. 10 is an electrical circuit diagram of a power transistor chip.

As shown in FIG. 6, the semiconductor chip 1 is configured by soldering a wafer chip 3 on the radiating plate 2 with solder 4. As shown in FIG. 5, many semiconductor chips 1 waiting for inspection of electrical characteristics are transferred in a metallic tray 5 which accommodates semiconductor chips 1 during the inspection period. The metallic tray 5 is connected to a tester 8 for inspecting electrical characteristics via a tester cable 7 with a crocodile clip 6. As shown in FIG. 7, a contact probe pin 11 is mounted on the tip of a contacting fixture connected to the tester 8 through a tester cable 10. The contact probe pin 11 has a structural such that a contacting pin 11a passes through the contact sleeve 11b, freely sliding within the sleeve 11b, and resiliently loaded in the contact sleeve by a spring 11c with the pin 11a protruding from the contact sleeve 11b.

As shown in FIGS. 7 and 8, a soldering fixture 12 is used for soldering the radiating plate 2 on the semiconductor wafer chip 3. The soldering fixture 12 comprises a lower fixture 13 for positioning and supporting the radiating plate 2, a middle fixture 14 for positioning the wafer chip 3 fixedly on the lower fixture 13, and a pressing fixture 15 mounted on the middle fixture 14. The lower fixture 13 includes spot facing holes 13a to fit and hold the radiating plate 2, recesses 13b for hydrogen ambient ventilation, and positioning holes 13c in which positioning pins 14a vertically mounted in the middle fixture 14 fit. As indicated in FIG. 9, the spot facing holes 13a are arranged in double or two rows. The solder 4 is melted and fixed in advance on the radiating plate 2 placed in the lower fixture 13. To melt and fix the solder 4, the radiating plate 2, on which the unmelted solder 4 is placed and overlaid, is put into a hydrogen oven. The middle fixture 14 has through holes 14b for positioning wafer chips at a position corresponding to spot facing holes 13a of the lower fixture 13. The pressing fixture 15 has weights 15a for applying pressure to each chip 1 to urge the wafer chip 3 against the solder 4 on the radiating plate 2.

The following is a description of an inspection method of a conventional semiconductor chip.

The radiating plate 2 is soldered on the wafer chip 3 before the inspection process, In the soldering operation, firstly, the radiating plate 2 on which the preliminary solder 4 is melted and fixed in advance is placed in the lower fixture 13 of the wafer-chip soldering fixture 12. At this time the solder 4 faces upwardly. Secondly, the middle fixture 14, having positioning pins 14a which are inserted in positioning holes 13c of the lower fixture 13, is overlaid on the lower fixture 13. Then, the wafer chip 3 is inserted in the through hole 14b of the middle fixture 14, and finally the pressing fixture 15 having weights 15a for applying pressure to each chip 1 is overlaid on top of that. After the completion of the soldering preparation, the soldering fixture 12 is put into the hydrogen ambient atmospheric oven where the temperature is controlled to satisfactorily melt the solder, thus bonding the radiating plate 2 to the wafer chip 3. After completing the soldering, the pressing fixture 15 and the middle fixture 14 of the soldering fixture 12 are removed at the exit of the hydrogen ambient atmospheric oven. Then each semiconductor chip 1 is cooled in the lower fixture 13, and transferred to the inspection process.

In the inspection process, the semiconductor chip 1 is transferred from the lower fixture 13 to the metallic tray 5 by means of a pair of vacuum tweezers (not shown in FIGs.), and then the tester cable 7 of the tester 8 is connected to the metallic tray 5 by means of the crocodile clip 6. In the same manner, a measurement circuit for inspecting characteristics of the semiconductor chips 1 is formed by pressing the contacting fixtures 9, which are connected to the tester 8 through tester cables 10, on a specific point (inspection point) on the upper surface of the wafer chip 3. When the contacting fixture 9 is pressed against the surface of the wafer chip 3, the compression spring 11c incorporated in the contact probe pin 11 flexes and an appropriate contacting pressure is applied to the contacting pin 11a. Then, a foot switch (not shown in FIGs.) under the inspection work table is operated to send a start command signal to the tester unit, and the inspection by the tester 8 can be carried out. The testing result is displayed on the front panel display (not shown in FIGs.), and an inspector sorts defective products. When there are a plurality of inspection points in one chip, the contacting fixture 9 should be moved in turn, and the same inspection procedure repeated. Conventionally, the inspection of characteristics of the semiconductor chip 1 has been made as described above. In the conventional inspection method, all the inspection-related works, such as transferring the finally assembled semiconductor chips 1 from the soldering fixture 12 to the metallic tray 5; inspecting; and sorting of good and defective products and transferring them to molded trays, has been done manually requiring enormous labor.

Furthermore, in the conventional method, as illustrated in FIG. 5, the semiconductor chip having a plurality of inspecting points allows the inspection of single transistor cells which is not practical. In addition, there is a problem in obtaining a correlation between characteristics of single chip units and operation in a mode when all the units are actuated. Therefore, an accurate and reliable classification of chips has been impossible.

Furthermore, as the contacting pressure of the contact probe pin 11 varies according to the hand pressure applied by inspectors, problems used to occur such as an instability in the measurement accuracy caused by contact failure and breakage of the chip caused by inaccurate positioning of the contact point during the inspection.

In addition, with regard to assembling accuracy of the wafer chip 3 against the outer shape of the radiating plate 2 after the solder bonding of these two members, there is a chance of inaccurate positioning of the wafer chip 3 by an extent of the clearance between the fixture and the work. Accordingly, in manner of positioning based on the reference to the outer shape of the radiating plate 2, there has been difficulty in modifying the fixture so that it enables contacting simultaneously a plurality of inspection points on one chip.

SUMMARY OF THE INVENTION

In order to overcome the above described problems, an object of the present invention is to provide an apparatus for inspecting characteristics of a semiconductor chip, wherein no manual labor work for the inspection of the semiconductor chips is necessary and, on the contrary, the inspection work can be successfully fully automated which can reduce the large number of man-hours required for the inspection and eliminate inaccurate sorting of chips due to human error. In addition, the handling operation between the assembling processes can be performed more effectively because the molded tray for receiving the inspected chips can be directly transferred to an automatic assembling machine of a succeeding manufacturing process.

The apparatus for inspecting characteristics of semiconductor chips comprises: a testing tray having a plurality of stepped positioning through-holes arranged in a row and each having a shoulder for supporting a semiconductor chip; slider means for moving the testing tray parallel with a row of positioning holes to locate each positioning hole in a predetermined inspecting position; first transfer means for transferring the semiconductor chips from supporting means before the inspection to the testing tray by means of a suction nozzle; upper contacting means having probe pins corresponds to inspection points on a surface of the semiconductor chip for positioning the probe pins on the inspection points of the semiconductor chip located in the inspecting position; lower contacting means having another set of probe pins situated below the positioning holes of the testing tray for contacting the semiconductor chip; a tester unit being for inspecting characteristics, the tester unit connected to the probe pins of the upper contacting means and of the lower contacting means; and second transfer means for discharging inspected semiconductor chips from the testing tray by means of another suction nozzle.

In an apparatus for inspecting characteristics of the semiconductor chip according to the present invention, no manual labor is required for the inspection work of the semiconductor chip. In addition, probe pins can be positioned against inspection points by means of location correction using a CCD camera, and all cells in a row inspected as a unit of one chip. Furthermore, since pushing forward the probe pins against the semiconductor chip is totally mechanical, therefore, probe pins can be pressed against all of semiconductor chips with a generally uniform pressing.

DESCRIPTION OF THE PREFERRED EMBODIMENTS

Figure 1:
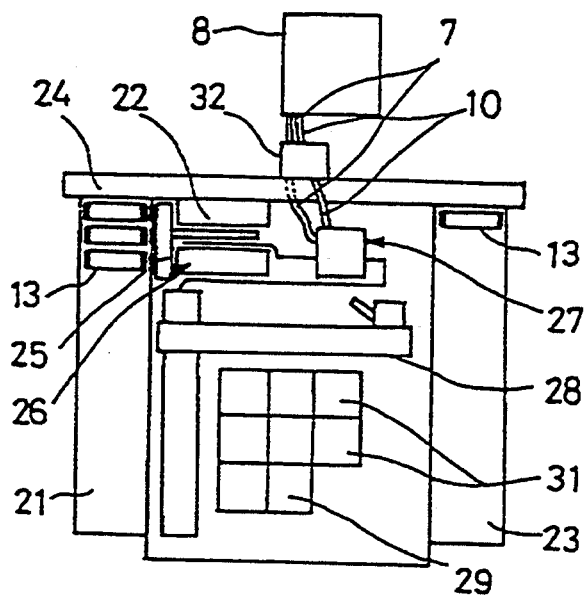
FIG. 1 is a plan view of an inspection apparatus for inspecting characteristics of semiconductor chips according to the present invention.
Figure 2:
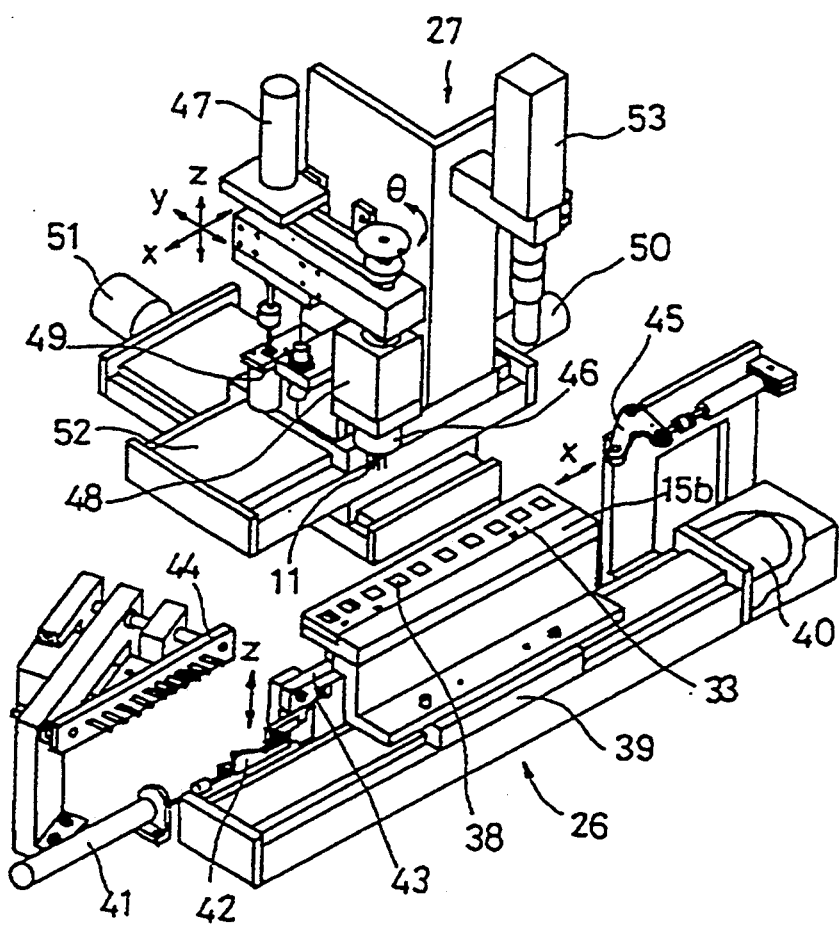
FIG. 2 is an enlarged perspective view of portion of an inspection apparatus for inspecting characteristics of semiconductor chips according to the present invention.
Figures 3, 4:
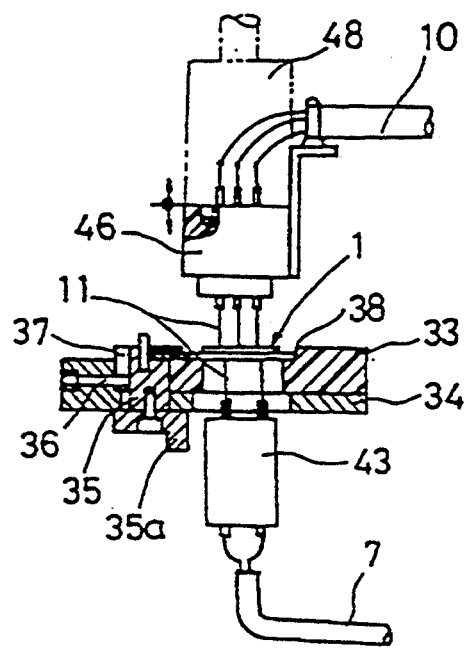
FIG. 3 is a sectional view of a testing tray employed in the inspection apparatus for inspecting characteristics of semiconductor chips according to the present invention.
FIG. 4 is a perspective view of a chips tray employed in the inspection apparatus for inspecting characteristics of semiconductor chips according to the present invention.
Figure 5:
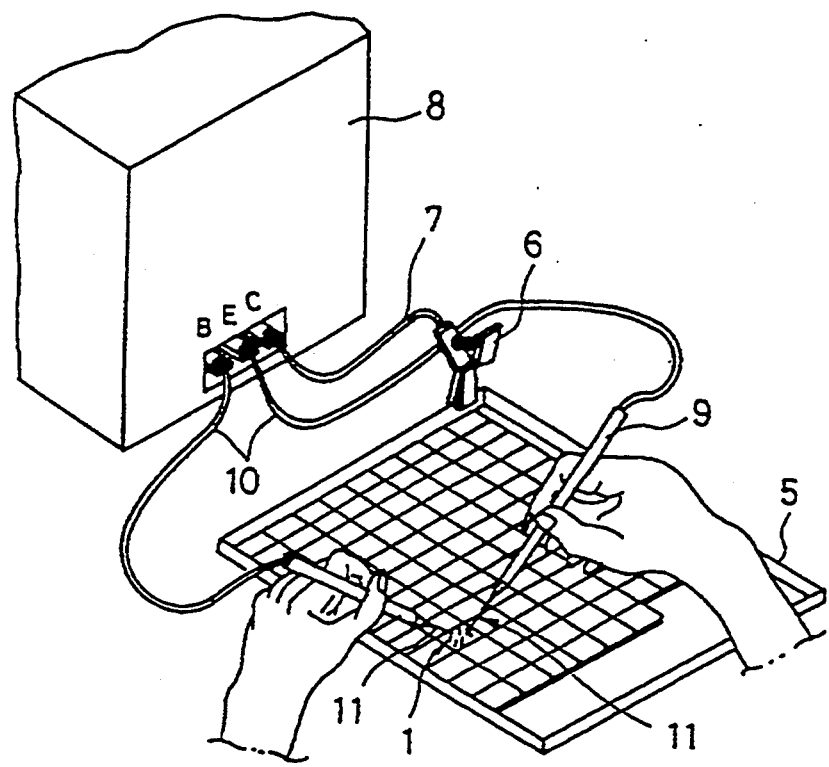
FIG. 5 is a perspective view illustrating a conventional manual inspection method for inspecting electrical characteristics of the semiconductor chip.
Figure 6:
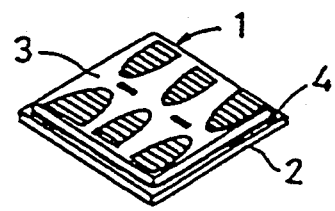
FIG. 6 is a perspective view illustrating a semiconductor chip to which a radiating plate is soldered.
Figure 7:
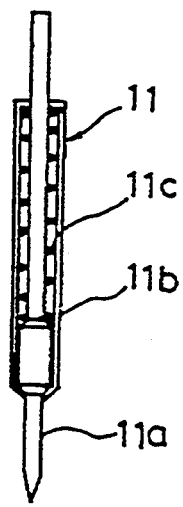
FIG. 7 is a sectional view of a contact probe pin employed in the conventional inspection apparatus.
Figure 8:
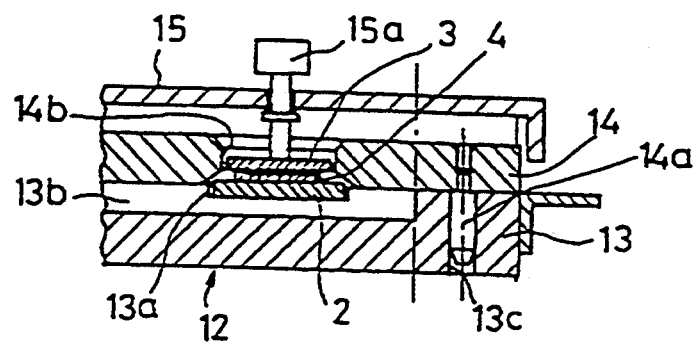
FIG. 8 is a sectional view of a soldering fixture employed for soldering a radiating plate to a semiconductor chip according to the prior art.
Figure 9:
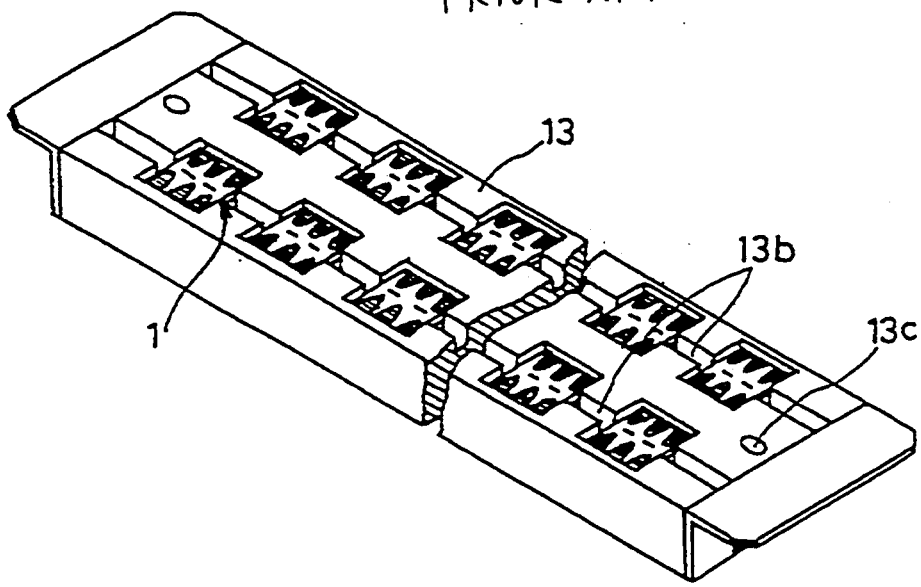
FIG. 9 is a perspective view of a lower fixture for soldering employed for soldering a radiating plate on the semiconductor chip.
Figure 10:
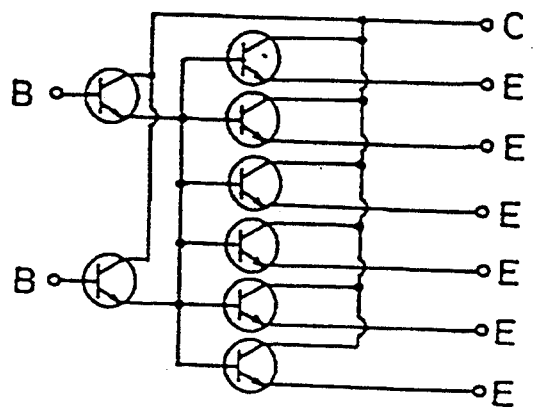
FIG. 10 is an electrical circuit diagram of a power transistor chip.

A detailed description of preferred embodiment of the present invention will now be given in conjunction with the accompanying drawings of FIG. 1 through FIG. 4. FIG. 1 is a plan view of an inspection apparatus for inspecting characteristics of semiconductor chips according to the present invention. FIG. 2 is an enlarged perspective view of a portion of the inspection apparatus for inspecting characteristics of semiconductor chips. FIG. 3 is a sectional view of a testing tray employed in the inspection apparatus for inspecting characteristics of semiconductor chip. Likewise, FIG. 4 is a perspective view of a chips tray employed with the inspection device. The same reference numerals are put on the identical or equivalent members with those described before in FIG. 5 to FIG. 10, and a detailed description for these members is omitted hereinafter.

In FIG. 1 through FIG. 4, a lower-fixture loading device 21 which supplies a finally assembled semiconductor chip to the lower soldering fixtures 13, a lower-fixture alignment device 22 which moves the lower fixtures 13 to a predetermined position, and a lower-fixture unloading device which discharges empty lower fixtures 13 after finishing the inspection are illustrated.

A lower-fixture handling device 24 travels between the lower-fixture loading device 21 and the alignment device 22, and between the alignment device 22 and the unloading device 23. A first means for transferring semiconductor-chips or a suitable chip transfer means 25, which is a vacuum suction type in this case, simultaneously attaches and transfers each row of semiconductor chips 1 from the lower-fixture alignment device 22 in a longitudinal direction of the lower fixture 13. A lower contact means or a lower contact device 26 aligns each semiconductor chip 1 transferred by the chip transfer means 25, and includes a lower contact fixture disposed at a predetermined position for electrical-contact operation (a detailed description of this fixture will be given later).

Upper contact means or an upper contact device 27 includes an upper contact fixture 46 for the plurality points of the electrical-contact operation with a surface of the semiconductor chip 1; a pattern recognition CCD camera to appropriately locate the upper contact fixture at a predetermined contact point; and means for feedback compensation of location points in three directions X, Y, and $\theta$ after receiving final pattern-processing data from the CCD camera.

A second means for transferring semiconductor-chips or a chip sorting and transferring robot 28 includes one nozzle for lifting each inspected chip from the lower contact device 26 and transferring the chip to the corresponding first chip-tray stacker 29 in accordance with the inspection results; and another nozzle, having the same stacker mechanism as the first chip-tray stacker 29, for lifting and transferring each empty tray 30 (shown in FIG. 4) to the corresponding second chip-tray stacker 31.

A relay box 32 is located between a tester 8 and the upper and lower contact fixtures.

A detailed description of the configuration of a contact actuation system of an inspection apparatus according to the present invention will be given in conjunction with FIG. 2 and FIG. 3. The testing tray 33, made of insulating materials, receives semiconductor chips 1, which are objects to be inspected, directly from the chip transfer means 25, and is mounted on the metallic base plate 34 having a metallic configuration. In every chip-pocket 38 of the testing tray 33, there is provided a chip alignment claw, made of a insulating material, exertine pressure produced by a compression spring 36 via a block 35. The chip pocket 38 has through holes in the testing tray 33, as shown in FIG. 2, and forms a row of a plurality of the chips 1 in the testing tray 33. Each chip pocket 38 supports the semiconductor chip 1 by means of a recess. A butting plate 35a is mounted on the lower portion of the block 35 for releasing each alignment claw. All the members relating to the testing tray 33 are fixed on a slider 39 through a mounting plate. The slider 39 is configured such that it can be reciprocatingly moved by means of a servo motor 40. The reciprocating movement of the slider 33 is designed along the same direction as the direction of the chip pockets 38. Namely, the testing tray 33 moves back and forth along the longitudinal direction of the tray 33 such that the chip pockets 38 may be located at inspection points. A lower contacting fixture 43 is mounted beneath the chip pockets 38 of the testing plate 33, and is moved up and down by means of an air cylinder 41 and a plate cam 42. In addition, a claw releasing-mechanism 44 for releasing all the claws 37 for chip alignment by means of a single cylinder is disposed near a locating point where the semiconductor chips 1 are transferred from the chip transfer means 25 to the testing tray 33. Furthermore, a claw release mechanism 45 for releasing only one chip-alignment claw by means of the cylinder drive is disposed such that the chip sorting and transferring robot 28 can lift and transfer the inspected semiconductor chips one by one after the testing tray 33 passes the inspection point. A chip locating device or the lower contact device 26 is configured in the above manner. The following description refers to the upper contact device 27. The upper contact fixture 46 is connected to a servo motor 47 through a timing belt and rotation head 48, and can rotate in the $\theta$ direction as shown in FIG. 2. A series of these $\theta$-rotation mechanisms is configured such that the mechanism can move up and down by means of a cylinder 49 and a linear guide, in which the down movement brings probe pins mounted on the end of the upper contact fixture 46 into contact with the semiconductor chip 1. Furthermore, the total unit including the mechanism of up and down movement is fixed on the cross table 52 which is moved in the X and Y directions by means of servo motors 50 and 51. The pattern recognition CCD camera 53 is fixed on the cross table 52 through a mounting plate. The upper and lower contact fixtures 46 and 43 both have insulating holders to which the contact probe pins 11 are fixed by pressure, and each end portion of the contact probe pin 11 of the upper and lower contact fixtures 46,43 is connected to tester cables 7 and 10 respectively. The upper contact fixture 46 includes contact probe pins 11, the number of which corresponds to the number of inspection points of a wafer chip.

The following is a description of an actuation of the inspection apparatus for inspecting characteristics of the semiconductor chips according to the present invention.

When a soldering process for semiconductor chips is completed after passing through a hydrogen ambient atmosphere in a pre-inspection process, the semiconductor chips 1 are cooled for a predetermined period in the lower fixture 13 after the holding fixture and middle fixture of the soldering fixtures are removed. Then, the semiconductor chips 1 are disposed all together on a belt conveyor (non shown in FIGs.) of the lower-fixture loading device 21 of the present inspection apparatus. The maximum loading capability on this conveyor is twenty fixtures. The transferring operation of the belt conveyor is continued until the lower fixture 13 reaches the stopping point of the deepest position of the lower-fixture loading device 21. The conveyor stops when a limit switch detects the arrival at the deepest position. Thus, the conveyor repeats its conditional intermittent motion.

The lower fixture 13 which has arrived at the stopping point is held by mechanical chucks of the lower-fixture handling device 24, and is transferred to the stage of the lower-fixture alignment 22 by means of cylinder drive. The position of the lower fixture 13 transferred to the lower-fixture alignment device 22 is determined by being pulled to the reference end face of a outer shape by means of alignment claws driven by the cylinder.

After receiving the input signal indicating the completion of the above mentioned positioning, a suction nozzle of the chip transfer means 25, which is waiting at the position right above the chips 1 contained in the lower fixture 13, descends by means of a cylinder drive. The suction nozzle lifts all of semiconductor chips 1 in a row at one time in the longitudinal direction of the lower fixture, then ascends and travels, by means of the servo motor, to a position above the chip pockets 38 of the testing tray 33 of the chip-locating device or the lower contact device 26, and then descends again to transfer the semiconductor chips 1 to the chip pockets 38. At this time, chip-alignment claws 37, energized by the compression spring 36 incorporated in the testing tray, have already been released by protruding members of the end portion of a claw releasing-mechanism 44 pushing back the butting plate 35a of the testing tray side before the chip is transferred, wherein, at such moment, the chip-alignment claws 37 of all the chip pockets 38 are released at one time.

The claw releasing-mechanism 44 returns to its original starting position after the recognition of the completion signal of the chips' transfer to the testing tray of the chip transfer device 25. Then, chip-alignment claws 37 will do an aligning movement, which means positioning each semiconductor chip at an orthogonal-reference corner side of the testing tray 33, for all of the semiconductor chips 1 on the testing tray 33 according to the pressure of the incorporated compression spring 36. As the chip-alignment claws 37 are mounted at an oblique angle of 45° degrees to the longitudinal reference end-surface of the testing tray 33, each single chip-alignment claw 37 is capable of positioning in two directions, X and Y.

By means of the servo motor 40 and the slider 39, the testing tray 33 which has completed the chip alignment is transferred to a recognition starting point determined by a control program and then stops. At the same time, the pattern recognition CCD camera 53 moves such that the camera's center is located in a positioning point predetermined by the control program by means of the servo motors 50, 51 and the cross table 52. Then, the CCD camera 53 is in a stand-by position waiting for the positioning completion of the first chip in the testing tray 33.

Then, after receiving the positioning-completion signal of the testing tray, the pattern recognition CCD camera 53 takes a picture pattern signal in a pattern processing unit; computes the error of the axial components X and Y, and of an angular component $\theta$ from the reference data; then outputs a feedback signal having a compensation value for the above three components to the servo motors 47, 50, and 51. Accordingly, the upper contact fixture 46 is located in a position so that inaccurate positioning of the wafer chip 3 that occurred during the soldering assembly, is compensated such that all the inspection points of a plurality of sections of the upper surface of the chip 1 can be contacted. When receiving the completion signal indicating completion of the positioning of the upper contact device 27, the up-and-down movement cylinder 49 descends. Then, firstly, the upper contact fixture 46 starts contacting the semiconductor chip to be inspected; and successively the lower contact fixture 43 ascends by means of up-and-down movement cylinder 41 and the plate cam 42; thus both upper and lower contacts to the chip are made and the measuring circuit for the inspection is formed. At the same time, a contact-completion signal is transmitted to the tester 8, and various characteristics-inspections can be carried out with predetermined testing conditions. After the completion of the testing, all the inspected chips 1 are sorted and classified into 5 classes maximum of good products, defective products, and products to be re-inspected. The testing results corresponding to each tested chip are sent back to the inspection apparatus as a feedback signal of the chip-quality determination. The inspection apparatus which has received the signal of the chip-quality determination moves the testing tray 33 of the lower contact device 26 by one pitch to carry out the pattern recognition of the second or succeeding semiconductor chip 1. Simultaneously, after the completion of positioning of the testing tray 33 and the claw releasing mechanism 45 has retracted the chip-alignment claws 37 corresponding to an inspection semiconductor chip 1, the chip sorting and transferring robot 28 executes its lifting and transferring operation to put the inspected semiconductor chip 1 into the chip tray stacker 29 which corresponds to a block of the chip-quality determination.

After the repetition of the a series of the recognition and contacting operations and the completion of the inspection and sorting classification of all the semiconductor chips 1 in the testing tray 33, the testing tray 33 returns to the positioning point of the chip transfer means 25, and thus the one complete cycle ends. Then, in succession, the lifting and transferring operation of the second row of the lower fixture 13 begins to repeat the next cycle of operation as the first operation. The number of the repeated cycles of this operation is as same as that of spot-facing holes of the lower fixture 13, and when the lower fixture 13 is emptied of chips 1, the lower fixture 13 is discharged to the lower-fixture unloading device 23 by the lower-fixture handling device 24 in reverse to the operation of the loading device 21. Simultaneously, the next lower fixture 13 of the loading device is supplied to the lower-fixture alignment device 22 and the positioning is made in the same method of the operation as described above. When the accommodation capacity of the tray for the inspected semiconductor chips 1 becomes full, one chip tray 30 is lifted from the empty chip-tray stacker 31 to replenish it in the chip-tray stacker 29 of full block as described above. Accordingly, the testing of chips characteristics is fully automated by repeating the full operation as described above.

In the preferred embodiment of the present invention, a power transistor chip for a power module is employed, and the soldering fixture for the chip assembly is used as a chip-supplying means. However, in case that a chip neither has a pattern on its element surface, like a diode chip, nor requires an accurate contacting of the probe pin, characteristics inspection by an automatic machine can also be possible in the same manner as the present invention by of automatic operation in a method of precluding the pattern-recognition operation by simply switching the controlling software, wherein the same effect can be obtained as the as if the power transistor is being employed.

Although the a preferred embodiment has been described to illustrate the present invention with the example of the a semiconductor chip to which the radiating plate 2 is soldered, a bare semiconductor chip having no radiating plates even can be expected to have the same effect as that of the present invention. All the peripheral portions or devices of the chip-contacting operation can be used for the same purpose by simply modifying a part of the apparatus wherein the specification of the chips-supplying loading device is changed from the lower fixture for soldering to supplying the chip tray and the like.

By using the apparatus for inspecting characteristics of the semiconductor chips according to the present invention, no manual labor for the inspection of the semiconductor chips is necessary. Fully-automated inspection work has successful effects of reducing the large number of man-hours required for the inspection and of eliminating inaccurate sorting of chips due to human error. Furthermore, the handling operation between the assembling processes can be performed more effectively because the molded tray for receiving the inspected chips can be directly transferred to an automatic assembling machine of the succeeding manufacturing process.

In addition, probe pins can be positioned against inspection points by means of the locating correction using the CCD camera, and all the cells in a row are inspected in a unit of one chip. Furthermore, pushing forward the probe pins to the semiconductor chip is totally done mechanically; therefore, the deflection of the compression spring incorporated in the probe pins unit can have a better repeatability and stable control of itself, and the contact pressure of end portions of probe pins is uniform. Therefore, the inspection accuracy improves in every chip, and the inspection of the chip can be done under conditions close to the practical conditions after the final assembly of the semiconductor chip. Accordingly, highly reliable classification of the chips by characteristics can be obtained yielding high efficiency in the finally assembled product and strategic assembling and shipping of the final products with assured characteristics classification.

What is claimed is:

1. An apparatus for inspecting characteristics of semiconductor chips comprising:

a testing tray having a plurality of stepped positioning through-holes arranged in a row extending in a direction, each positioning hole having a shoulder for supporting a semiconductor chip;

slider means for moving said testing tray parallel to the direction of the row of positioning holes to locate each positioning hole in a predetermined inspecting position sequentially;

first transfer means for transferring semiconductor chips from a supporting means, holding the semiconductor chips before an inspection, to said testing tray by means of a vacuum nozzle;

upper contacting means having probe pins corresponding to respective inspection points on a surface of a semiconductor chip for positioning said probe pins at the corresponding inspection points of a semiconductor chip located in the inspecting position;

lower contacting means having probe pins disposed below said testing tray for contacting a semiconductor chip located in the inspecting position from underneath;

a tester unit for inspecting electrical characteristics of a semicondutor chip, said tester unit being connected to said probe pins of said upper contacting means and of said lower contacting means; and second transfer means for discharging inspected semiconductor chips from said testing tray by means of a vacuum nozzle.

2. The apparatus as defined in claim 1 wherein said upper contacting means includes a pattern recognition CCD camera for positioning said upper contacting means at a predetermined contacting point, and correcting means for correcting a contacting position relative to the predetermined contacting point in response to pattern processing of said pattern recognition CCD camera.

3. The apparatus as defined in claim 1 wherein said second transfer means for discharging inspected semiconductor chips includes means for lifting and transferring the semiconductor chips, and storage means for storing the semiconductor chips.

* * * * *